US008116470B2

(12) United States Patent
Shirakihara

(10) Patent No.: US 8,116,470 B2
(45) Date of Patent: Feb. 14, 2012

(54) IMPULSE RESPONSE PROCESSING APPARATUS AND REVERBERATION IMPARTING APPARATUS

(75) Inventor: Futoshi Shirakihara, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 454 days.

(21) Appl. No.: 12/475,314

(22) Filed: May 29, 2009

(65) Prior Publication Data

US 2009/0296962 A1 Dec. 3, 2009

(30) Foreign Application Priority Data

May 30, 2008 (JP) ................................ 2008-143509

(51) Int. Cl.
*H03G 3/00* (2006.01)

(52) U.S. Cl. ........................................... 381/63; 381/61

(58) Field of Classification Search .................... 381/61, 381/63
See application file for complete search history.

(56) References Cited

U.S. PATENT DOCUMENTS 5,272,274 A * 12/1993 Kimura ........................... 84/658
5,553,150 A * 9/1996 Kozuki ........................... 381/61
5,619,579 A * 4/1997 Ando et al. ..................... 381/63
5,689,571 A * 11/1997 Kitamura ........................ 381/63
5,880,390 A * 3/1999 Hagiwara ........................ 84/630
6,483,922 B1 * 11/2002 Limacher ........................ 381/63
6,782,105 B1 * 8/2004 Sahara et al. ................... 381/63
6,978,027 B1 * 12/2005 Dahl et al. ...................... 381/63

FOREIGN PATENT DOCUMENTS

EP 1 463 030 A2 9/2004
EP 1 463 030 A3 9/2004
JP 09-146549 A 6/1997
JP 2004-294712 10/2004
WO WO-99/17277 A1 4/1999

OTHER PUBLICATIONS

European Search Report completed Sep. 16, 2009, for EP Application No. 09006998.0, four pages.

* cited by examiner

*Primary Examiner* — Luan C Thai
(74) *Attorney, Agent, or Firm* — Morrison & Foerster LLP

(57) ABSTRACT

An impulse response processing apparatus is composed of a waveform divider, a time adjuster, an interpolation processor and a waveform synthesizer. The waveform divider divides an impulse response into a plurality of base blocks on a time axis. The time adjuster increases a time difference between two adjacent ones of the plurality of the base blocks. The interpolation processor generates an interpolation block. The waveform synthesizer generates a new impulse response by arranging the interpolation block between the two adjacent base blocks generated through adjustment of the time adjuster.

12 Claims, 7 Drawing Sheets

IMPULSE RESPONSE PROCESSING APPARATUS AND REVERBERATION IMPARTING APPARATUS

BACKGROUND OF THE INVENTION

1. Technical Field of the Invention

The present invention relates to a technology for processing an impulse response used to impart reverberation.

2. Description of the Related Art

A technology for changing a time length during which reverberation continues (which will be referred to as a "reverberation time") in an apparatus for imparting reverberation to a sound signal through convolution of an impulse response has been suggested. For example, Japanese Patent Application Publication No. 2004-294712 describes a technology in which a new impulse response having a desired reverberation time is generated by summing (i.e., linearly combining) two types of impulse responses after multiplying each of the impulse responses by an exponential function.

However, in the technology of Japanese Patent Application Publication No. 2004-294712, the magnitude of noise such as background noise superimposed on the impulse response is also amplified since the magnitude of the impulse response is increased through multiplication by the exponential function. Accordingly, the prior art technology has a problem in that the sound quality of the reverberant sound added to the sound signal is degraded.

SUMMARY OF THE INVENTION

The invention has been made in view of these circumstances, and it is an object of the invention to change the reverberation time while maintaining the sound quality of the reverberant sound.

In order to achieve the above object, an impulse response processing apparatus according to the invention includes a waveform dividing part that divides an impulse response into a plurality of base blocks on a time axis, a time adjustment part that increases a time difference between each two adjacent ones of the plurality of the base blocks, an interpolation processing part that generates an interpolation block, and a waveform synthesis part that generates a new impulse response by arranging the interpolation block between the two adjacent base blocks generated through adjustment of the time adjustment part.

In this configuration, since the reverberation time is extended by increasing the time difference between each two adjacent base blocks generated through division of the impulse response, it is possible to generate a new impulse response of a reverberant sound with high quality in which noise is suppressed, compared to a configuration wherein the reverberation time is extended by increasing the amplitude of the impulse response. In addition, since the interpolation block is disposed between each adjacent two base blocks, it is possible to generate a new impulse response of a reverberant sound that is aurally natural, compared to the case where a new impulse response is generated by simply increasing the interval between each adjacent two base blocks.

In a preferable embodiment of the invention, the interpolation processing part includes an averaging part that calculates an interpolation block by averaging or summing each two adjacent ones of the base blocks, and the waveform synthesis part generates the new impulse response by arranging the interpolation block calculated by the averaging part between the two adjacent ones of the base blocks that the averaging part has used to calculate the interpolation block. In this embodiment, since the interpolation block is generated by obtaining the average or sum (including a weighted sum) of each two adjacent ones of the plurality of base blocks, it is possible to generate a natural new impulse response in which the base blocks and interpolation blocks have similar acoustic characteristics, compared to the case where the interpolation block is generated independently of the base blocks.

If acoustic characteristics such as frequency characteristics of base and interpolation blocks that are adjacent are excessively similar, a reverberant sound generated according to the new impulse response may be perceived to be aurally unnatural. Therefore, in a preferable embodiment of the invention, the interpolation processing part includes a waveform processing part that modifies a waveform represented by an interpolation block (for example, the interpolation block generated by the averaging part), and the waveform synthesis part generates the new impulse response using an interpolation block generated through modifying of the waveform processing part.

In this embodiment, it is possible to generate a new impulse response of a reverberant sound that is aurally natural since it is possible to cause the acoustic characteristics of the interpolation and base blocks to be moderately different. As a specific configuration for modifying the waveform of the interpolation block, it is preferable to employ a configuration wherein the waveform represented by the interpolation block is reversed in the direction of the time axis, or a configuration wherein the phase in the frequency domain of the waveform represented by the interpolation block is rotated.

In a preferable embodiment of the invention, the interpolation processing part includes an amplitude adjustment part that adjusts an amplitude of each interpolation block so that an amplitude of the interpolation block disposed between each two adjacent base blocks generated through adjustment of the time adjustment part increases as the time difference between each two adjacent base blocks generated through adjustment of the time adjustment part increases, and the waveform synthesis part generates the new impulse response using the interpolation block generated through adjustment of the amplitude adjustment part. In this configuration, it is possible to generate a new impulse response of a reverberant sound that is aurally natural since the amplitudes of both the base and interpolation blocks of the new impulse response are made uniform.

The impulse response processing apparatus according to a preferable embodiment of the invention further includes a first windowing part (for example, a windowing part 34 in FIG. 2 or FIG. 12) that multiplies each base block by a window function whose value decreases toward both ends of the base block, wherein the waveform dividing part divides the impulse response into the plurality of base blocks so that each two adjacent base blocks partially overlap, and the waveform synthesis part generates the new impulse response using each base block generated through processing of the first windowing part.

In this embodiment, there is an advantage in that it is possible to generate a new impulse response of a natural reverberant sound in which the base and interpolation blocks are smoothly connected since base blocks that partially overlap are used to generate the new impulse response after each of the base blocks is multiplied by a window function.

In another preferable embodiment of the invention, the interpolation processing part includes a second windowing part (for example, a windowing part 56 in FIG. 4 or FIG. 10) that multiplies each interpolation block by a window function whose value decreases toward both ends of the base block, and the waveform synthesis part generates the new impulse response using each interpolation block generated through processing of the second windowing part.

In a preferable embodiment of the invention, the waveform synthesis part generates the new impulse response by arranging a plurality of interpolation blocks between each two adjacent ones of the plurality of base blocks. In this embodiment, it is possible to generate a new impulse response with a reverberation time increased by a high scaling factor since a plurality of interpolation blocks are arranged between adjacent two base blocks.

A reverberation imparting apparatus according to the invention includes an impulse response processing apparatus according to each of the above embodiments, and a reverberation imparting part that performs convolution of a sound signal and a new impulse response generated by the impulse response processing apparatus. The reverberation imparting apparatus achieves the same operations and advantages as those of the impulse response processing apparatus according to each of the above embodiments.

The impulse response processing apparatus according to each of the embodiments may not only be implemented by hardware (electronic circuitry) such as a Digital Signal Processor (DSP) dedicated to impulse response processing but may also be implemented through cooperation of a general arithmetic processing unit such as a Central Processing Unit (CPU) with a computer program. A program according to the invention causes a computer to perform a waveform dividing process to divide an impulse response into a plurality of base blocks on a time axis, a time adjustment process to increase a time difference between each two adjacent ones of the plurality of the base blocks, an interpolation processing process to generate an interpolation block, and a waveform synthesis process to generate a new impulse response by arranging the interpolation block between the two adjacent base blocks generated through the time adjustment process. The program achieves the same operations and advantages as those of the impulse response processing apparatus according to each of the above embodiments. The program of the invention may be provided to a user through a computer readable recording medium storing the program and then be installed on a computer and may also be provided from a server device to a user through distribution over a communication network and then be installed on a computer.

DETAILED DESCRIPTION OF THE INVENTION

A: First Embodiment

Figure 1:
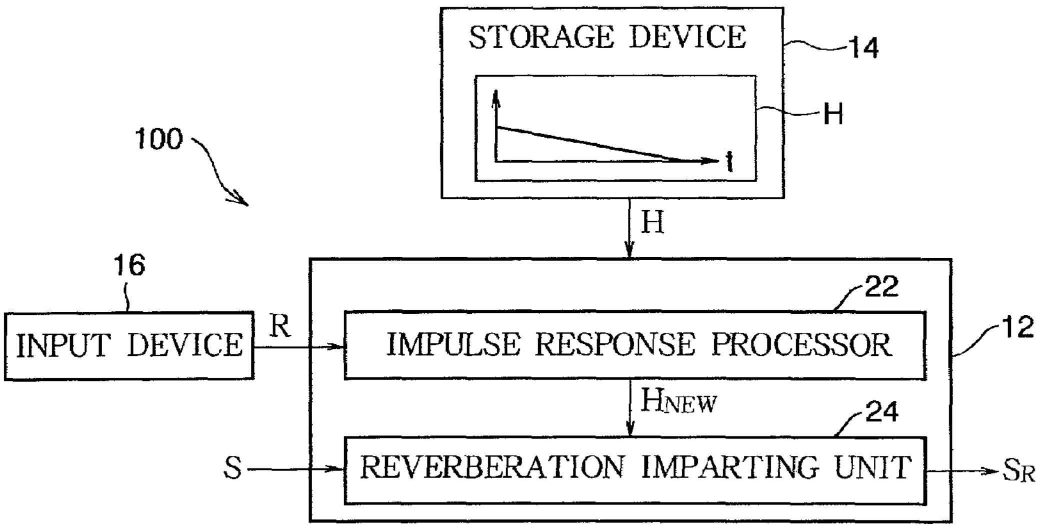
FIG. 1 is a block diagram of a reverberation imparting apparatus according to the first embodiment of the invention.

FIG. 1 is a block diagram of a reverberation imparting apparatus according to the first embodiment of the invention. A sound signal S representing the waveform of a (musical or vocal) sound is provided to a reverberation imparting apparatus 100. Examples of a sound source (not shown) that provides the sound signal S include a sound receiving device that generates a sound signal S according to an ambient sound or a playback device that sequentially acquires and outputs a sound signal S from a recording medium. The reverberation imparting apparatus 100 generates a reverberant sound signal $S_R$ by adding reverberation to the sound signal S and outputs the reverberant sound signal $S_R$. The reverberant sound signal $S_R$ is provided to a sound emitting device (not shown) such as a speaker or headphones, which then reproduces the reverberant sound signal $S_R$ as a sound wave.

As shown in FIG. 1, the reverberation imparting apparatus 100 is a computer system that includes an arithmetic processor 12, a storage device 14, and an input device 16. The storage device 14 stores a program that is executed by the arithmetic processor 12 and stores data that is used by the arithmetic processor 12. For example, a sequence of samples (specifically, a sequence of coefficients obtained through convolution) representing the waveform of an impulse response H is stored in the storage device 14. A known recording medium such as a semiconductor storage device or a magnetic storage device is used as the storage device 14.

The arithmetic processor 12 functions as a plurality of elements including an impulse response processor 22 and a reverberation imparting unit 24 by executing the program stored in the storage device 14. The elements of the arithmetic processor 12 may each be mounted in a distributed manner on a plurality of devices such as integrated circuits or may each be implemented by an electronic circuit (DSP) dedicated to processing the sound signal S.

The impulse response processor 22 processes the impulse response H stored in the storage device 14 and generates a sample sequence representing the waveform of a new impulse response $H_{NEW}$ which has different characteristics such as reverberation time from those of the impulse response H. The new impulse response $H_{NEW}$ is a signal representing a waveform obtained by extending the reverberation time to be R times longer than that of the impulse response H (1<R=2). The reverberation imparting unit 24 generates a reverberant sound signal $S_R$ by performing a filtering process such as convolution on the sound signal S using the new impulse response $H_{NEW}$ generated by the impulse response processor 22. The reverberation imparting unit 24 may use any known technology to generate the reverberant sound signal $S_R$.

The input device 16 includes an operating unit that the user operates to input instructions for the reverberation imparting apparatus 100. The user can adjust the scaling factor R of the reverberation time by operating the input device 16.

Figure 2:
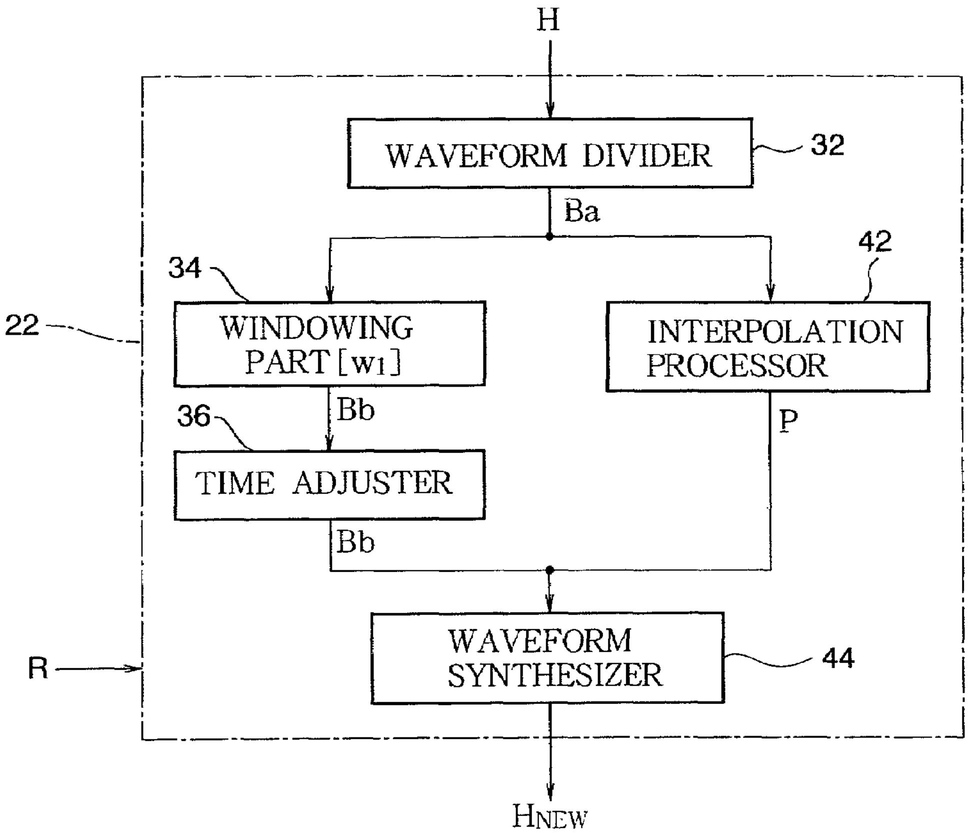
FIG. 2 is a block diagram of an impulse response processor.
Figure 3:
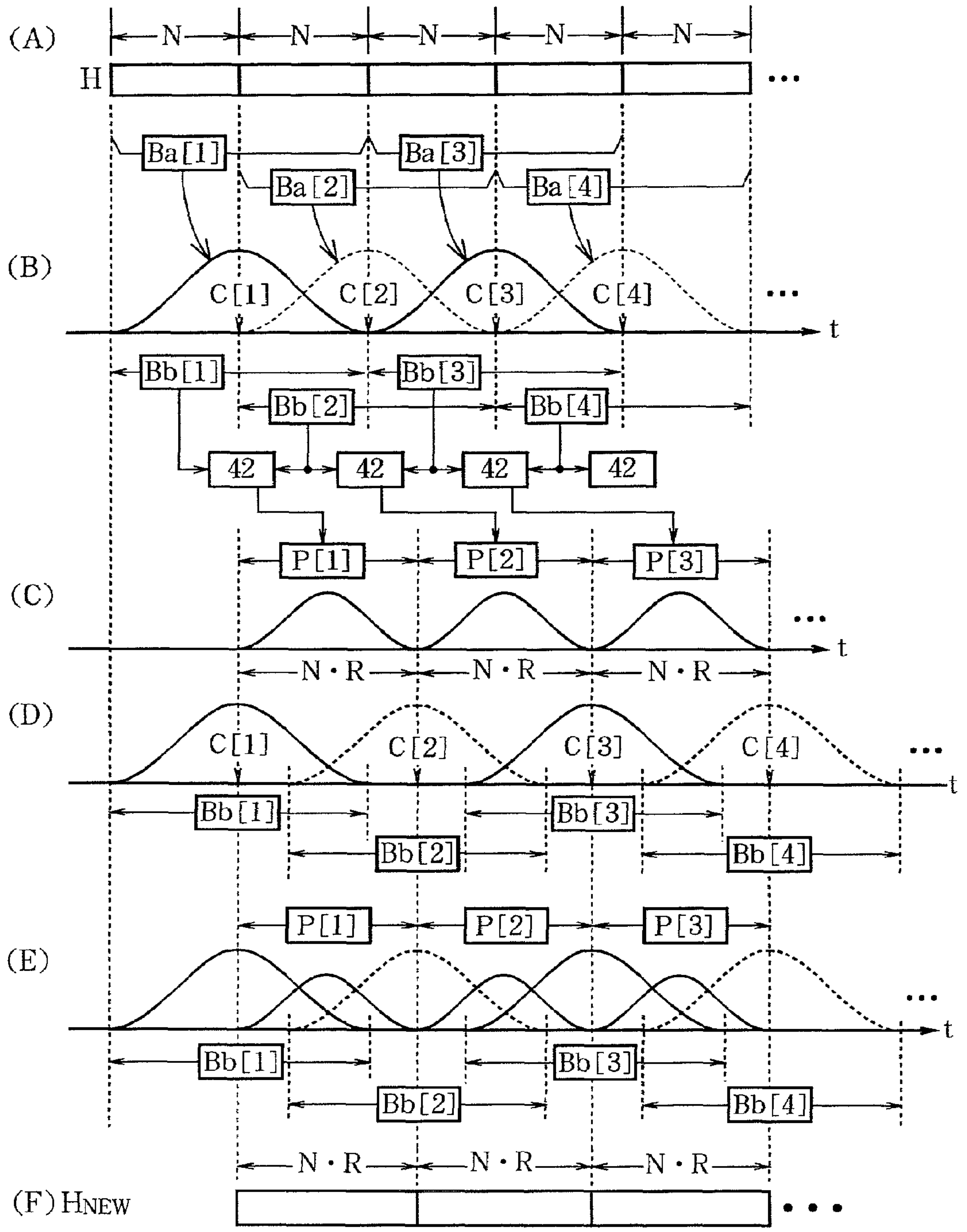
FIG. 3 is a conceptual diagram illustrating the operation of the impulse response processor.

FIG. 2 is a block diagram of the impulse response processor 22. FIG. 3 is a conceptual diagram illustrating specific processes performed by the impulse response processor 22. As shown in FIG. 2, the impulse response processor 22 includes a waveform divider (waveform dividing part) 32, a windowing part 34, a time adjuster (time adjustment part) 36, an interpolation processor (interpolation processing part) 42, and a waveform synthesizer (waveform synthesis part) 44.

The waveform divider 32 divides the impulse response H stored in the storage device 14 into a plurality of sections (which will be referred to as "base blocks") Ba (Ba[1], Ba[2], . . . ) on the time axis. As shown in FIG. 3(A), each base block Ba includes 2N samples of the impulse response H (for example, N=64). The time difference between each two adjacent base blocks Ba corresponds to N samples. Accordingly, every two adjacent base blocks Ba partially overlap. More specifically, N samples as the latter half of each base block Ba[i] (i=1, 2, . . . ) and N samples as the former half of an immediately subsequent base block Ba[i+1] are the same.

The windowing part 34 in FIG. 2 multiplies the base blocks Ba[i] generated through division of the waveform divider 32 by a window function w1 to generate base blocks Bb[i] (Bb [1], Bb[2], . . . ). Each base block Bb includes 2N samples. Here, it is preferable that a function whose value decreases toward both ends (ideally, a function whose value is zero at both ends) be used as the window function w1. In FIG. 3(B), each base block Bb generated through multiplication by the window function w1 is schematically illustrated by a curve representing the waveform of the window function w1. For the sake of convenience, even-numbered base blocks Bb (Bb [2], Bb[4], . . . ) are shown by dotted lines for discrimination from odd-numbered base blocks Bb (Bb[1], Bb[3], . . . ) shown by solid lines. In this embodiment, a Hanning window W(n) defined by the following Equation (1) is employed as the window function w1.

$$W(n)=0.5-0.5\cos(n\pi/N) \quad (1)$$

The time adjuster 36 in FIG. 2 shifts each base block Bb generated through processing of the windowing part 34 on the time axis. The time adjuster 36 of this embodiment adjusts the position of each base block Bb on the time axis so that the time difference (interval) between each two adjacent base blocks Bb is increased. More specifically, as shown in FIG. 3(D), the time adjuster 36 adjusts (i.e., delays) the position of each base block Bb so that the interval between a central point C[i], on the time axis, of a base block Bb[i] and a central point C[i+1], on the time axis, of an immediately subsequent base block Bb[i+1] is equal to a time length (N·R) which is obtained by multiplying the (initial unadjusted) time length corresponding to N samples of the impulse response H by the scaling factor (expansion rate) R.

The interpolation processor 42 in FIG. 2 generates interpolation blocks P (P[1], P[2], . . . ). Each interpolation block P is a sample sequence (i.e., a set of N·R samples) that has a time length obtained by multiplying the time length corresponding to the N samples of the impulse response H by the scaling factor R. As shown in FIG. 30, adjacent base blocks Bb[i] and Bb[i+1] are used to generate an intermediate interpolation block P[i]. A detailed example of the processing of the interpolation processor 42 will be described later.

The waveform synthesizer 44 in FIG. 2 arranges (i.e., interpolates) the interpolation blocks P (P[1], P[2], . . . ) generated by the interpolation processor 42 between the base blocks Bb (Bb[1], Bb[2], . . . ) generated through adjustment of the time adjuster 36 to generate a new impulse response $H_{NEW}$ as shown in FIG. 3(E). Specifically, the interpolation block P[i] is arranged between the base block Bb[i] and the adjacent base block Bb[i+1] that are used to generate the interpolation block P[i]. The position of the interpolation block P[i] on the time axis is determined such that the start point of the interpolation block P[i] coincides with the central point C[i] of the preceding base block Bb[i] while the end point of the interpolation block P[i] coincides with the central point C[i+1] of the succeeding base block Bb[i+1]. That is, the central point of the interpolation block P[i] coincides with a position that is equidistant from the central point C[i] of the base block Bb[i] and the central point C[i+1] of the next base block Bb[i+1].

For each base block Bb and each interpolation block P that are arranged on the time axis as described above, the waveform synthesizer 44 sums the values of samples, which correspond to the same time point, of the base block Bb and the interpolation block P for each time point. The new impulse response $H_{NEW}$ illustrated in FIG. 3(F) is a time series of the sums of the values of the samples of the base blocks Bb and the interpolation blocks P. Accordingly, the reverberation time of the new impulse response $H_{NEW}$ is R times greater than the reverberation time of the impulse response H. The user can freely adjust the reverberation time of the reproduced sound of the reverberant sound signal $S_R$ by operating the input device 16 to specify an appropriate scaling factor R.

Figure 4:
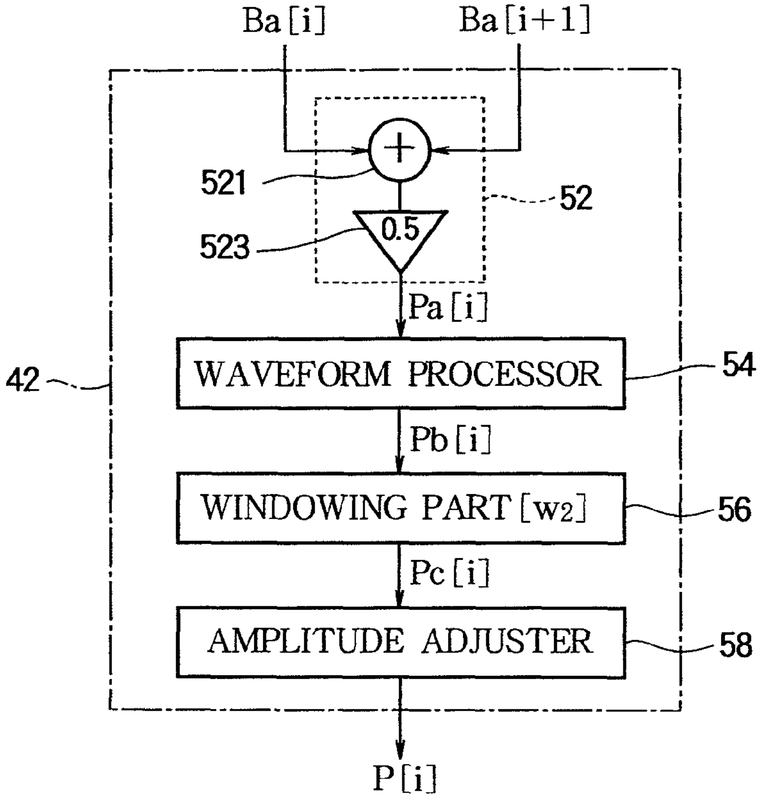
FIG. 4 is a block diagram of an interpolation processor.

The following is a description of a detailed example of the interpolation processor 42 with reference to FIG. 4. As shown in FIG. 4, the interpolation processor 42 of this embodiment includes an averager 52, a waveform processor 54, a windowing part 56, and an amplitude adjuster (amplitude adjustment part) 58. For each base block Ba generated through division of the waveform divider 32, the averager 52 averages the base block Ba[i] and the next base block Ba[i+1] that are adjacent on the time axis to generate an interpolation block Pa[i]. More specifically, the averager 52 includes an adder 521 and a multiplier 523. For the 2N samples of the base block Ba[i] and the 2N samples of the base block Ba[i+1], the adder 521 sums the values of samples of the same time point of the base block Ba[i] and the base block Ba[i+1] for each time point. The multiplier 523 multiplies 2N samples generated through the summation of the adder 521 by "0.5". 2N samples generated through multiplication of the multiplier 523 constitute the interpolation block Pa[i].

The waveform synthesizer 44 may use the interpolation block Pa[i] generated by the averager 52 as the interpolation block P[i] to generate the new impulse response $H_{NEW}$. However, a waveform represented by the interpolation block Pa[i] is very similar to waveforms represented by the base block Ba[i] and the base block Ba[i+1] used to generate the interpolation block Pa[i]. Thus, similar waveforms will be repeatedly arranged in the new impulse response $H_{NEW}$ generated by arranging the interpolation block Pa[i] between the base block Bb[i] and the base block Bb[i+1]. This may cause the listener to perceive aural incongruity (or aural abnormalities) such as undulation in the reproduced sound of the reverberant sound signal $S_R$. On the other hand, the interpolation block P[i] may also be generated independently of the base block Ba[i] and the base block Ba[i+1]. However, this may cause the listener to perceive aural incongruity in the reproduced sound of the reverberant sound signal $S_R$ due to the difference between acoustic characteristics such as frequency characteristics of each base block Bb and each interpolation block P.

Figure 5:
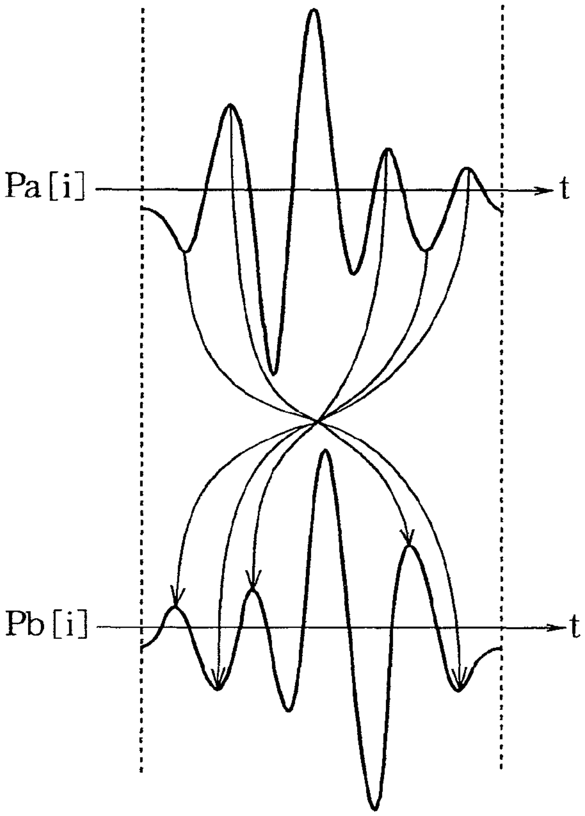
FIG. 5 is a conceptual diagram illustrating the processing of a waveform processor.

Thus, the waveform processor 54 of this embodiment modifies the waveform represented by the interpolation block Pa[i] generated by the averager 52 to generate a modified interpolation block Pb[i]. As shown in FIG. 5, the waveform processor 54 of this embodiment generates the interpolation block Pb[i] by reversing the waveform represented by the interpolation block Pa[i] in the direction of the time axis. That is, the interpolation block Pb[i] is a sequence of 2N samples obtained by reversing the order of the 2N samples of the interpolation block Pa[i]. If the interpolation block P[i] generated through modification of the waveform processor 54 is used as described above, waveforms that are moderately similar to each other will be repeated in the new impulse response $H_{NEW}$ so that the listener perceives the reproduced sound of the reverberant sound signal $S_R$ as a natural sound.

The windowing part 56 in FIG. 4 multiplies each interpolation block Pb[i] generated through the processing of the waveform processor 54 by a window function w2 to generate an interpolation block Pc[i]. Here, it is preferable that a function whose value decreases toward both ends (ideally, a function whose value is zero at both ends) be used as the window function w2. In this embodiment, a Hanning window W(n) defined by the above Equation (1) is employed as the window function w2.

The amplitude (i.e., the value of each sample) of the interpolation block Pc[i] generated through the processing of the windowing part 56 is the product of the window function w2 and the average of the amplitudes of the base block Bb[i] and the base block Bb[i+1]. Therefore, for example in the case where the interpolation block Pc[i] is used as the interpolation block P[i] to generate the new impulse response $H_{NEW}$, the amplitude of the new impulse response $H_{NEW}$ is excessive at a portion where the interpolation block Pc[i] is inserted, thereby causing the listener to perceive aural incongruity in the reproduced sound of the reverberant sound signal $S_R$. Accordingly, the amplitude adjuster 58 in FIG. 4 reduces the amplitude (i.e., the value of each sample) of a waveform represented by the interpolation block Pc[i] to generate the final interpolation block P[i].

Figure 6:
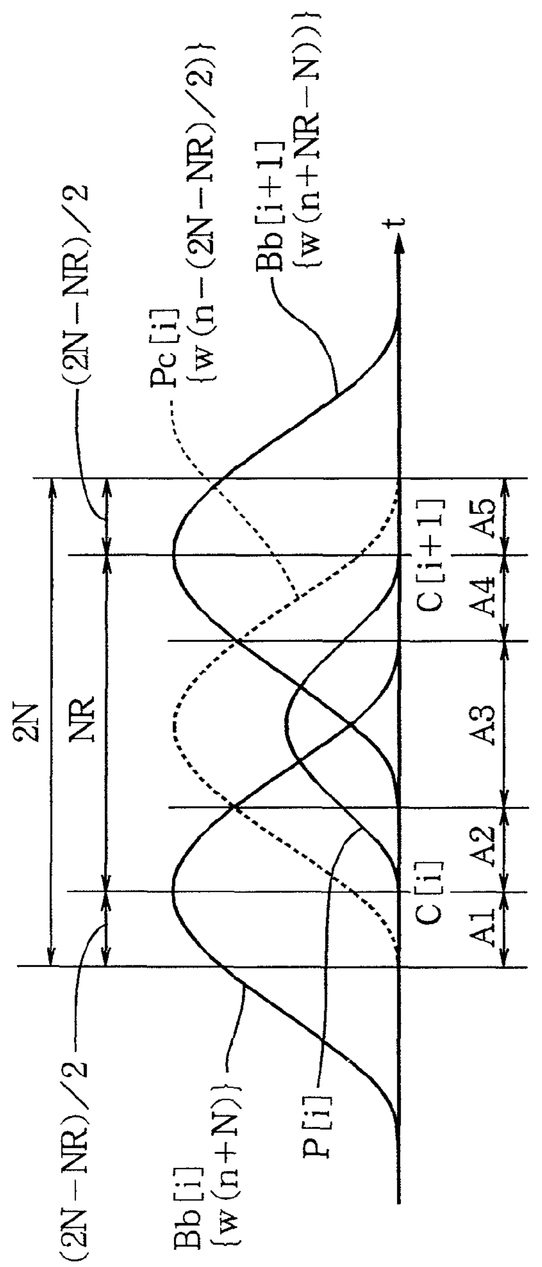
FIG. 6 is a conceptual diagram illustrating the processing of an amplitude adjuster.

FIG. 6 is a conceptual diagram illustrating the operation of the amplitude adjuster 58. In FIG. 6, the base block Bb[i], the base block Bb[i+1], and the interpolation block Pc[i] generated by the windowing part 56 are schematically illustrated by curves representing the shapes of Hanning windows w(n) (w(n)=0.5−0.5 cos(nπ/N)) as examples of the window function w1 and the window function w2. In FIG. 6, the interpolation block Pc[i] is arranged such that the central point thereof coincides with a time point that is equidistant from the central point C[i] of the base block Bb[i] and the central point C[i+1] of the base block Bb[i+1].

As shown in FIG. 6, a portion of the range of the base blocks Bb[i] and Bb[i+1], which corresponds to 2N samples of the impulse response H, is divided into five sections $A_1$ to $A_5$ according to the relations between the interpolation block Pc[i] and the base blocks Bb[i] and Bb[i+1]. The section $A_1$ is a portion before the central point C[i] of the base block Bb[i], and the section $A_2$ is a portion where the amplitude of the window function w1 corresponding to the base block Bb[i] exceeds the amplitude of the window function w2 corresponding to the interpolation block Pc[i]. The section $A_3$ is a portion where the amplitude of the window function w2 corresponding to the interpolation block Pc[i] exceeds the amplitude of each window function w1 corresponding to the base block Bb[i] and the base block Bb[i+1]. The section $A_4$ is a portion where the amplitude of the window function w1 corresponding to the base block Bb[i+1] exceeds the amplitude of the window function w2 corresponding to the interpolation block Pc[i], and the section $A_5$ is a portion after the central point C[i+1] of the base block Bb[i+1].

In FIG. 6, the interpolation block P[i] that has been adjusted by the amplitude adjuster 58 is schematically illustrated together with the interpolation block Pc[i] that has not been adjusted by the amplitude adjuster 58. The amplitude adjuster 58 generates the interpolation block P[i] by adjusting the amplitude of the interpolation block Pc[i] so that the amplitude of the sum of the window function w1 of the base block Bb[i], the window function w1 of the base block Bb[i+1], and the window function corresponding to the interpolation block P[i] becomes a predetermined value (typically, "1") over the overall range. More specifically, first, the amplitude adjuster 58 sets the value of each sample belonging to the section $A_1$ and the section $A_5$ among the 2N samples of the interpolation block Pc[i] to zero. Then, the amplitude adjuster 58 multiplies each sample of the section $A_2$ of the interpolation block Pc[i] by "w(n)/w(n−(2N−NR)/2)", multiplies each sample of the section $A_3$ by "{w(n)−w(n−NR+N)/w(n−(2N−NR)/2)", and multiplies each sample of the section $A_4$ by "w(n+2N−NR)/w(n−(2N−NR)/2)". The waveform synthesizer 44 uses a sequence of N·R samples obtained according to the method described above, which belong to the sections $A_2$ to $A_4$, as the interpolation block P[i] to synthesize the new impulse response $H_{NEW}$.

Figure 7:
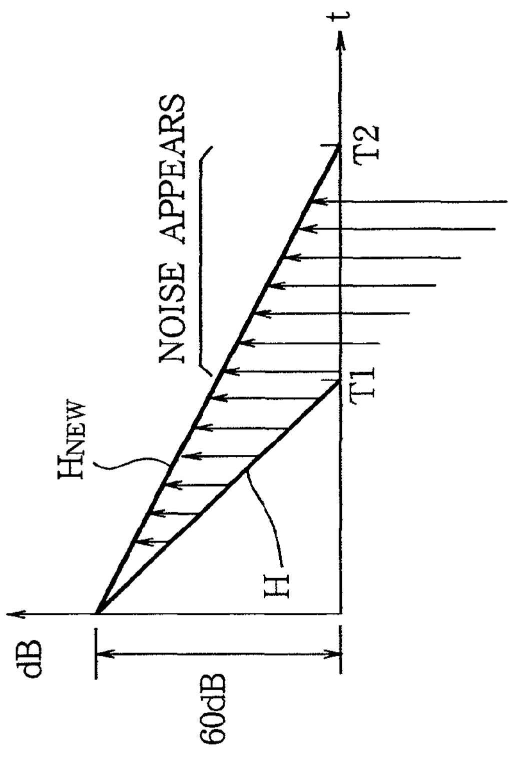
FIG. 7 is a conceptual diagram illustrating how an impulse response is processed in a comparative example.

A configuration wherein the reverberation time is extended by multiplying the impulse response H by an exponential function a(t) is described below as an example for comparison with this embodiment. In this comparative example, the new impulse response Has is generated by multiplying the impulse response H by the exponential function a(t), for example as represented in the following Equation (2). In the configuration of the comparative example, the amplification ratio of the amplitude (strength) of the new impulse response $H_{NEW}$ to the amplitude of the impulse response H exponentially increases toward the rear end of the impulse response H as shown in FIG. 7, and therefore the magnitude of noise such as background noise superimposed on the rear part of the impulse response H appears in the new impulse response $H_{NEW}$. Thus, the comparative example has a problem in that the sound quality of the reverberant sound decreases as the reverberation time of the new impulse response $H_{NEW}$ increases, compared to that of the impulse response H.

$$H_{NEW} = a(t)\cdot H \qquad (2)$$
$$a(t) = 10^{3\left(\frac{1}{T_1}-\frac{1}{T_2}\right)t}$$

In contrast to the comparative example, this embodiment overcomes the problem that the magnitude of noise of the impulse response H emerges in the new impulse response $H_{NEW}$ since, in this embodiment, the impulse response H is not amplified according to the scaling factor R but instead the new impulse response $H_{NEW}$ is generated by increasing the time difference between each of the plurality of base blocks Ba (Bb) into which the impulse response H is divided (i.e., by extending the impulse response H in the direction of the time axis). Accordingly, this embodiment can extend the reverberation time while maintaining the sound quality of the reverberant sound. This embodiment can also generate a reverberant sound which is aurally natural, compared to the case where the new impulse response $H_{NEW}$ is generated by simply increasing the interval between each base block Bb (i.e., between each two adjacent base blocks Bb), since the interpolation block P is arranged between each base block Bb in this embodiment.

Further, the base blocks Bb and the interpolation blocks P generated through multiplication by the window functions w1 and w2 are continuously connected on the time axis since the sample value of each of the base blocks Bb and the interpolation blocks P decreases toward both ends. Accordingly, this embodiment has an advantage in that it is possible to generate a new impulse response $H_{NEW}$ capable of generating a reverberant sound which is aurally natural compared to the case where the envelope is discontinuous at the connection portion of each base block Bb or each interpolation block P.

B: Second Embodiment

A description will now be given of the second embodiment of the invention. In the first embodiment, the waveform processor 54 reverses the waveform of the interpolation block Pa[i] generated by the averager 52 in the direction of the time axis. The waveform processor 54 of this embodiment generates an interpolation block Pb[i] by rotating the phase of the interpolation block Pa[i] generated by the averager 52. Elements in each of the following embodiments which are shared with the first embodiment are denoted by the same reference numerals and a detailed description thereof is appropriately omitted.

Figure 8:
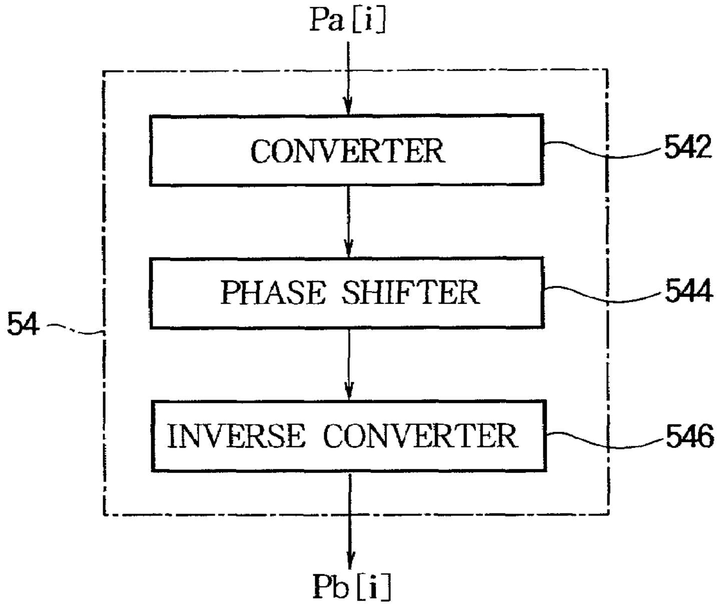
FIG. 8 is a block diagram of a waveform processor according to the second embodiment.

FIG. 8 is a block diagram of the waveform processor 54 in this embodiment. As shown in FIG. 8, the waveform processor 54 includes a converter 542, a phase shifter 544, and an inverse converter 546. The converter 542 converts the interpolation block Pa[i] into a signal of the frequency domain (i.e., a frequency spectrum), for example using Fourier transform. The phase shifter 544 rotates the phase of (the frequency spectrum of) the interpolation block Pa[i] generated through conversion of the converter 542 by a predetermined angle θ. The inverse converter 546 converts the interpolation block Pa[i] generated through the processing of the phase shifter 544 into a signal of the time domain (i.e., the interpolation block Pb[i]).

The waveform processor 54 of this embodiment configured as described above generates an interpolation block Pb[i] having frequency characteristics which are moderately similar to (i.e., which are neither excessively similar to or excessively different from) those of the base block Bb[i] or the base block Bb[i+1]. Accordingly, similar to the first embodiment, this embodiment can generate a new impulse response $H_{NEW}$ capable of generating a reverberant sound which is aurally natural, compared to the configuration wherein the interpolation block Pa[i] is used as the final interpolation block P[i] or the configuration wherein the interpolation block P[i] is generated independently of the base block Bb[i] and the base block Bb[i+1].

C: Third Embodiment

The following is a description of the third embodiment of the invention. In the first embodiment, it is assumed that the scaling factor R of the reverberation time is equal to or less than 2. One purpose of this embodiment is to extend the reverberation time by a scaling factor R of greater than 2. In the case where the scaling factor R is less than or equal to 2 in this embodiment, the reverberation time is extended through the same procedure as the first or second embodiment.

Figure 9:
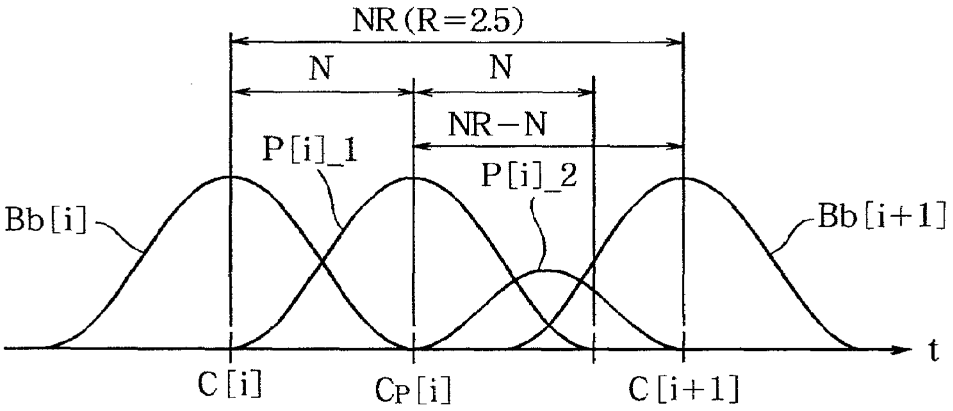
FIG. 9 is a conceptual diagram illustrating the operation of an impulse response processor according to the third embodiment.

FIG. 9 is a conceptual diagram illustrating the operation of this embodiment. When the scaling factor R is greater than 2, for example when R=2.5, the interval (N·R) between the central points C[i] and C[i+1] of the base blocks Bb[i] and Bb[i+1] generated through adjustment of the time adjuster 36 is greater than a section of 2N samples of the impulse response H. Accordingly, the magnitude of a section corresponding to the interval between the base block Bb[i] and the base block Bb[i+1] in the new impulse response $H_{NEW}$ is not sufficient if only one interpolation block P[i] including 2N samples is disposed between the base block Bb[i] and the base block Bb[i+1]. Thus, as shown in FIG. 9, the waveform synthesizer 44 generates a new impulse response $H_{NEW}$ by arranging a plurality of interpolation blocks P[i] (P[i]_1 and P[i]_2) between the base block Bb[i] and the base block Bb[i+1] generated through adjustment of the time adjuster 36.

The interpolation block P[i]_1 in FIG. 9 is a sequence of 2N samples generated from the base block Ba[i] and the base block Ba[i+1]. The waveform synthesizer 44 disposes the interpolation block P[i] on the time axis so that the start point of the interpolation block P[i]_1 coincides with the central point C[i] of the base block Bb[i]. On the other hand, the interpolation block P[i]_2 in FIG. 9 is a sequence of {NR−N} samples generated from the base block Ba[i] and the base block Ba[i+1]. The waveform synthesizer 44 disposes the interpolation block P[i]_2 between the interpolation block P[i]_1 and the base block Bb[i+1]. More specifically, the waveform synthesizer 44 selects the position of the interpolation block P[i]_2 on the time axis so that the start point of the interpolation block P[i]_2 coincides with the central point $C_p$[i] of the interpolation block P[i]_1 while the end point of the interpolation block P[i]_2 coincides with the central point C[i+1] of the base block Bb[i+1].

Figure 10:
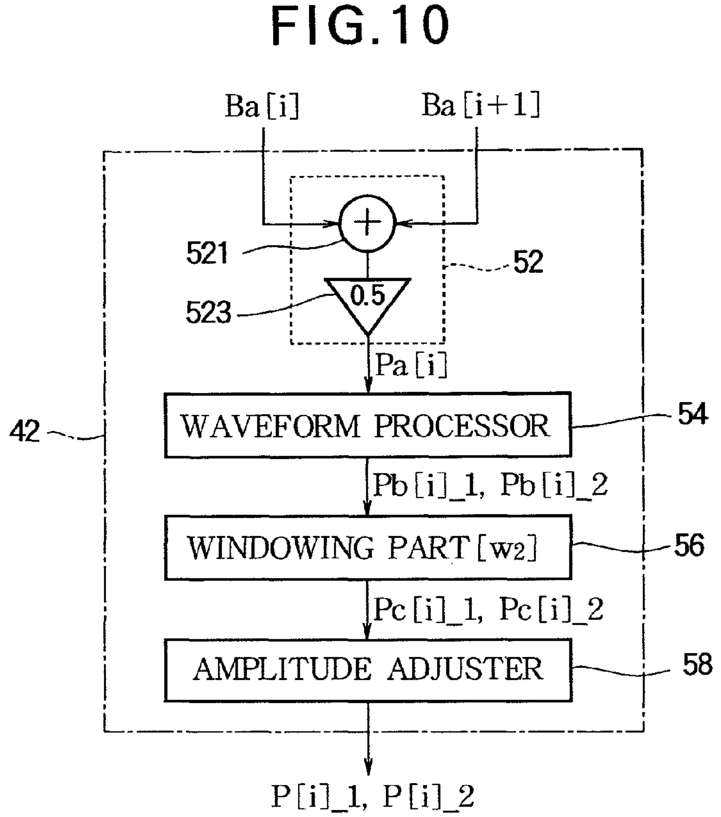
FIG. 10 is a block diagram of an interpolation processor according to the third embodiment.

FIG. 10 is a block diagram of the interpolation processor 42 according to this embodiment. As shown in FIG. 10, the waveform processor 54 generates a plurality of interpolation blocks Pb[i] (Pb[i]_1 and Pb[i]_2), which have different frequency characteristics, from the interpolation block Pa[i] generated by the averager 52. The waveform processor 54 is preferably configured as that of the second embodiment shown in FIG. 8. More specifically, the waveform processor 54 generates two interpolation blocks Pb[i] (Pb[i]_1 and Pb[i]_2) by changing the rotation angle θ of the phase of the interpolation block Pa[i]. For example, the waveform processor 54 generates the interpolation block Pb[i]_1 by rotating the phase of the interpolation block Pa[i] by an angle of θ1 and generates the interpolation block Pb[i]_2 by rotating the phase of the interpolation block Pa[i] by an angle of θ2, where θ2≠θ1.

The windowing part 56 in FIG. 10 generates a plurality of interpolation blocks Pc[i] (Pc[i]_1 and Pc[i]_2) by multiplying each of the plurality of interpolation blocks Pb[i] generated through the processing of the waveform processor 54 by the window function w2. First, the amplitude adjuster 58 sets the interpolation block Pc[i]_1 as the interpolation block P[i]_1 in FIG. 9. Then, the amplitude adjuster 58 generates an interpolation block P[i]_2 including {NR−N} samples by adjusting the amplitude and the time length (the number of samples) of the interpolation block Pc[i]_2 through the processing illustrated in FIG. 6. The waveform synthesizer 44 uses the plurality of interpolation blocks P[i] (P[i]_1 and P[i]_2), which the amplitude adjuster 58 has generated in the above procedure, to generate a new impulse response $H_{NEW}$ as illustrated in FIG. 9. In this embodiment, the plurality of interpolation blocks P[i] are disposed between the base block Bb[i] and the base block Bb[i+1] of the impulse response H so that it is possible to set the scaling factor R of the reverberation time to be 2 or more.

Figure 11:
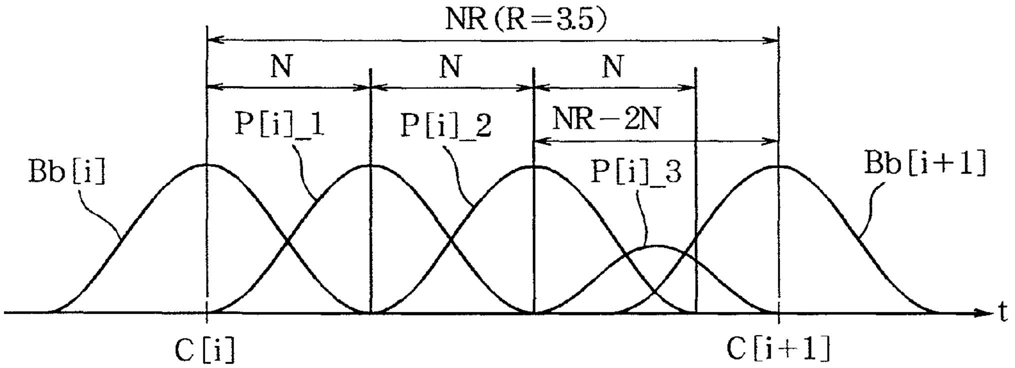
FIG. 11 is a conceptual diagram illustrating the operation of an impulse response processor according to the third embodiment.

Although two interpolation blocks P[i] are disposed between the base block Bb[i] and the base block Bb[i+1] in FIG. 9, three or more interpolation blocks P[i] are disposed therebetween when the scaling factor R is 3 or more. For example, when the scaling factor R is 3.5, two interpolation blocks P[i] (P[i]_1 and P[i]_2), each including 2N samples, and one interpolation block P[i] (P[i]_3) including {NR−2N} samples are disposed between the base block Bb[i] and the base block Bb[i+1] as shown in FIG. 11. That is, this method can be generalized using an integer part "r" of the scaling factor R, such that (r−1) interpolation blocks P[i] (P[i]_1, . . . , and P[i]_r−1), each including 2N samples, and one interpolation block P[i]_r including {NR−(r−1)N} samples are disposed between the base block Bb[i] and the base block Bb[i+1].

D: Example Modifications

Various modifications can be made to each of the above embodiments. The following are specific examples of such modifications. It is also possible to freely select and combine two or more from the following modifications.

Figure 12:
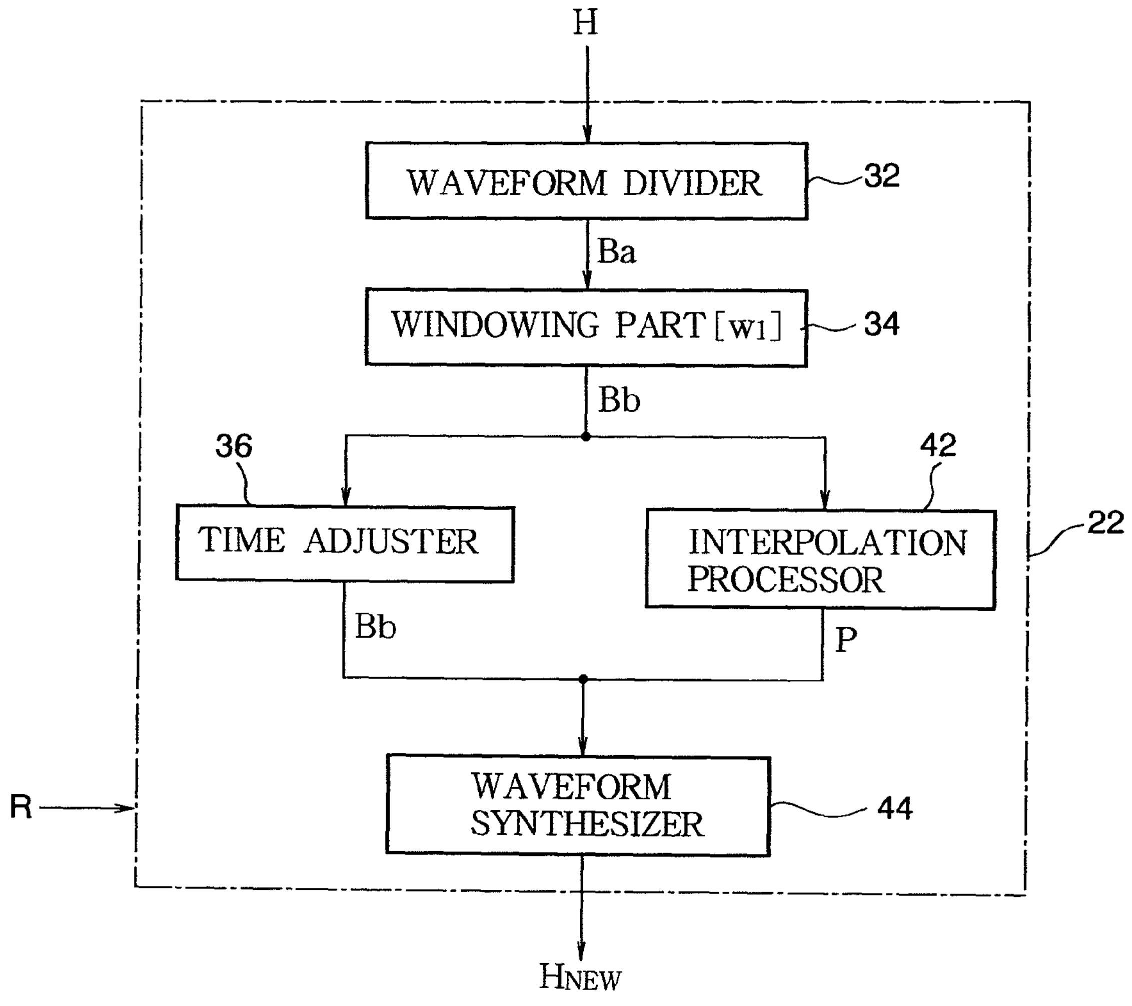
FIG. 12 is a block diagram of an interpolation processor according to an example modification.

(1) Example Modification 1

Where or when multiplication by the window function w1 is performed is appropriately changed. For example, in the embodiment of FIG. 2, it is also possible to employ a configuration wherein the windowing part 34 multiplies each base block Bb generated through adjustment of the time adjuster 36 by the window function w1. It is also preferable to employ a configuration wherein the interpolation processor 42 processes the base block Bb that the windowing part 34 has generated through multiplication by the window function w1 as shown in FIG. 12. In the configuration of FIG. 12, the windowing part 56 of the interpolation processor 42 is omitted.

In addition, while the amplitude adjuster 58 adjusts the amplitude of the interpolation block Pc[i] generated through multiplication by the window function w2 in each of the above embodiments, it is also preferable to employ a configuration wherein the windowing part 56 multiplies the interpolation block Pb[i] by the window function w2, the amplitude of which has been adjusted according to the time difference between the base block Bb[i] and the base block Bb[i+1], to generate the interpolation block P[i].

(2) Example Modification 2

Details of the window function w1 or the window function w2 are optional and any known window function (a Hanning or triangular window) can be freely used as the window function w1 or the window function w2. However, it is not essential to use the window function w1 or the window function w2 in the invention. For example, it is possible to employ a configuration wherein the time adjuster 36 extends the interval between each base block Ba generated through division of the waveform divider 32 and the waveform synthesizer 44 then inserts an interpolation block P into the interval between each base block Ba to generate a new impulse response $H_{NEW}$. Accordingly, partial overlapping of each base block Ba is also not essential in the invention. However, in the configuration wherein no window function is used, for example in the configuration wherein base blocks Ba do not overlap, a reverberant sound may be discontinuous in boundaries between base blocks Ba and interpolation blocks P, thereby causing a reduction in sound quality. Accordingly, taking into consideration the need to naturally connect base blocks Ba and interpolation blocks P, it is important to use the window function w1 or the window function w2 after setting each base block Ba so as to partially overlap, and it is especially preferable to use a window function whose value decreases toward both ends.

(3) Example Modification 3

The method for generating the interpolation block P is diverse in the invention. While the initial interpolation block Pa[i] is generated by averaging the base block Ba[i] and the base block Ba[i+1] in the above embodiments, it is also possible to employ a configuration wherein the averager 52 calculates the sum (including a weighted sum) of the base block Ba[i] and the base block Ba[i+1] as the interpolation block Pa[i]. In addition, the bases for calculating the interpolation block Pa[i] are not limited to the base block Ba[i] and the base block Ba[i+1]. For example, it is possible to employ a configuration wherein one base block Ba[i] (or one base block Ba[i+1]) is used as the interpolation block Pa[i] or a configuration wherein three or more consecutive base blocks Ba are summed or averaged to calculate the interpolation block Pa[i]. However, the configuration wherein base blocks Ba extracted from the impulse response H are used to generate interpolation blocks P is not essential in the invention. For example, it is possible to employ a configuration wherein interpolation blocks Pa previously created independently of the impulse response H (i.e., independently of the base blocks Ba) (for example, blocks created through division of a different impulse response having characteristics similar to those of the impulse response H) are used to generate interpolation blocks P[i].

In FIGS. 4 and 10, the waveform processor 54, the windowing part 56, or the amplitude adjuster 58 are appropriately omitted from the interpolation processor 42. In addition, the order of the processing of the components of the interpolation processor 42 is changed. For example, the waveform processor 54 modifies the waveform of the interpolation block Pb generated through processing of the windowing part 56.

(4) Example Modification 4

The method for causing the frequency characteristics of the plurality of interpolation blocks P[i] (P[i]_1, P[i]_2, . . . ) generated by the interpolation processor 42 to be different in the third embodiment is not limited to the method of changing the rotation angle θ of the phase of each interpolation block P[i]. For example, it is also possible to employ a configuration wherein odd-numbered interpolation blocks Pb are generated by reversing the waveform of the interpolation block Pa on the time axis as illustrated in FIG. 5 and interpolation blocks Pa generated by the averager 52 are used as even-numbered interpolation blocks Pb. However, in the third embodiment, it is also possible to employ a configuration wherein frequency characteristics of the plurality of interpolation blocks P[i] (P[i]_1, P[i]_2, . . . ) generated by the interpolation processor 42 are the same.

(5) Example Modification 5

While the reverberation imparting apparatus 100 including the impulse response processor 22 and the reverberation imparting unit 24 is illustrated in the above embodiments, an impulse response processing apparatus (i.e., the impulse response processor 22) constructed by removing the reverberation imparting unit 24 from the reverberation imparting apparatus 100 of FIG. 1 can also be provided according to the invention. A new impulse response $H_{NEW}$ generated by the impulse response processing apparatus is, for example, provided to a separate reverberation imparting apparatus 100 (i.e., the reverberation imparting unit 24) through a portable recording medium or a communication network and is then used to generate a reverberant sound.

What is claimed is:

1. An impulse response processing apparatus comprising:

a waveform dividing part that divides an impulse response into a plurality of base blocks on a time axis;

a time adjustment part that increases a time difference between two adjacent ones of the plurality of the base blocks;

an interpolation processing part that generates an interpolation block; and a waveform synthesis part that generates a new impulse response by arranging the interpolation block between the two adjacent base blocks generated through adjustment of the time adjustment part.

2. The impulse response processing apparatus according to claim 1, wherein the interpolation processing part includes an averaging part that calculates the interpolation block by averaging or summing the two adjacent ones of the plurality of the base blocks, and the waveform synthesis part generates the new impulse response by arranging the interpolation block calculated by the averaging part between the two adjacent ones of the plurality of the base blocks that are used by the averaging part for calculating the interpolation block.

3. The impulse response processing apparatus according to claim 1, wherein the interpolation processing part includes a waveform processing part that modifies a waveform of the interpolation block, and the waveform synthesis part generates the new impulse response using the interpolation block generated through modifying of the waveform processing part.

4. The impulse response processing apparatus according to claim 3, wherein the waveform processing part reverses the waveform of the interpolation block in a direction of the time axis.

5. The impulse response processing apparatus according to claim 3, wherein the waveform processing part rotates a phase of the waveform of the interpolation block in a frequency domain.

6. The impulse response processing apparatus according to claim 1, wherein the interpolation processing part includes an amplitude adjustment part that adjusts an amplitude of the interpolation block so that the amplitude of the interpolation block arranged between the two adjacent base blocks generated through adjustment of the time adjustment part increases as the time difference between the two adjacent base blocks generated through adjustment of the time adjustment part increases, and the waveform synthesis part generates the new impulse response using the interpolation block generated through adjustment of the amplitude adjustment part.

7. The impulse response processing apparatus according to claim 1, further comprising a first windowing part that multiplies each base block by a window function whose value decreases toward both ends of the base block, wherein the waveform dividing part divides the impulse response into the plurality of the base blocks so that the two adjacent base blocks partially overlap with each other, and the waveform synthesis part generates the new impulse response using each base block generated through processing of the first windowing part.

8. The impulse response processing apparatus according to claim 7, wherein the interpolation processing part includes a second windowing part that multiplies each interpolation block by a window function whose value decreases toward both ends of the interpolation block, and the waveform synthesis part generates the new impulse response using each interpolation block generated through processing of the second windowing part.

9. The impulse response processing apparatus according to claim 1, wherein the waveform synthesis part generates the new impulse response by arranging a plurality of interpolation blocks between the two adjacent ones of the plurality of the base blocks.

10. A reverberation imparting apparatus comprising:

a waveform dividing part that divides an impulse response into a plurality of base blocks on a time axis;

a time adjustment part that increases a time difference between two adjacent ones of the plurality of the base blocks;

an interpolation processing part that generates an interpolation block;

a waveform synthesis part that generates a new impulse response by arranging the interpolation block between the two adjacent base blocks generated through adjustment of the time adjustment part; and a reverberation imparting part that performs convolution on a sound signal and the new impulse response for imparting a reverberation to the sound signal.

11. The reverberation imparting apparatus according to claim 10, wherein the time adjustment part increases the time difference between the two adjacent ones of the plurality of the base blocks by a variable expansion rate, and the reverberation imparting part performs the convolution on the sound signal and the new impulse response for imparting the reverberation to the sound signal such that a time length of the reverberation corresponds to the expansion rate.

12. A computer readable recording medium for use in a computer, containing a program executable by the computer to perform:

a waveform dividing process to divide an impulse response into a plurality of base blocks on a time axis;

a time adjustment process to increase a time difference between two adjacent ones of the plurality of the base blocks;

an interpolation processing process to generate an interpolation block; and a waveform synthesis process to generate a new impulse response by arranging the interpolation block between the two adjacent base blocks generated through the time adjustment process.

* * * * *